(12) United States Patent
Chan

(10) Patent No.: US 6,502,050 B1
(45) Date of Patent: Dec. 31, 2002

(54) MEASURING A MINIMUM LOCK FREQUENCY FOR A DELAY LOCKED LOOP

(75) Inventor: Siuki Chan, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 368 days.

(21) Appl. No.: 09/597,879

(22) Filed: Jun. 20, 2000

(51) Int. Cl.[7] ................................................ G06F 1/04
(52) U.S. Cl. ...................... 702/117; 702/116; 702/126; 702/176; 702/177
(58) Field of Search ........................ 702/46, 58, 74–76, 702/78–80, 106, 116, 117, 126, 176, 177, 182; 375/376, 375; 331/34

(56) References Cited

U.S. PATENT DOCUMENTS

| | | | | |
|---|---|---|---|---|
| 6,081,147 A | * | 6/2000 | Okajima | 327/284 |
| 6,295,328 B1 | * | 9/2001 | Kim et al. | 375/376 |
| 6,337,601 B1 | * | 1/2002 | Klemmer | 331/34 |
| 6,348,839 B1 | * | 2/2002 | Aramaki | 331/57 |
| 2002/0021179 A1 | * | 2/2002 | Ooishi et al. | 331/57 |

OTHER PUBLICATIONS

"The Programmable Logic Data Book 1999", available from Xilinx, Inc., 2100 Logic Drive, San Jose, CA 95124, pp. 3–1 to 3–23.

Xilinx Application Note XAPP132, "Using the Virtex Delay–Locked Loop", (May 23, 2000, version 2.2), available from Xilinx, Inc., 2100 Logic Drive, San Jose, CA 95124, pp. 1–15.

* cited by examiner

*Primary Examiner*—Marc Hoff
*Assistant Examiner*—Felix Suarez
(74) *Attorney, Agent, or Firm*—Norman R. Klivans; Skjerven Morrill; Luis D. Cartier

(57) ABSTRACT

A method and structure for measuring the minimum lock frequency of a delay locked loop (DLL) within a programmable integrated circuit device such as a field programmable gate array (FPGA). The device is temporarily configured such that one DLL is programmed as a ring oscillator (RO) and connected directly to the input terminal of a second DLL (the DLL under test). Optionally, the RO is connected to the DLL under test through a divider to provide a lower DLL drive frequency. To test the DLL, the RO frequency is decreased until the DLL under test fails to lock. The frequency of the RO at that point is measured by comparing its output signal to the known frequency of an external clock source using two counters, and decremented until the DLL locks successfully. The lock frequency of the DLL under test is then computed from the ratio of the counter values.

34 Claims, 3 Drawing Sheets

MEASURING A MINIMUM LOCK FREQUENCY FOR A DELAY LOCKED LOOP

BACKGROUND OF THE INVENTION

1. Field Of the Invention

This invention relates to testing integrated circuits (ICs), specifically field programmable gate arrays (FPGAs).

2. Description of the Related Art

Highly complicated field programmable gate array integrated circuits have become common in electronic system design. One important component of modern FPGAs, such as the Virtex™ family by Xilinx®, Inc., are stable locked loops such as the delay lock loop (DLL). The Virtex family of FPGAs is described on pages 3-1 to 3–23 of "The Programmable Logic Data Book 1999" (hereinafter the Xilinx Data Book), which pages are incorporated herein by reference. DLLs are described in Xilinx Application Note XAPP132, "Using the Virtex Delay-Locked Loop" (May 23, 2000, version 2.2), available from Xilinx, Inc., which is incorporated herein by reference.

The all-digital DLL of the Virtex family of FPGAs eliminates clock propagation delay and skew between a clock input to the FPGA device and the internal clock distribution network within the device. Additionally, the DLL eliminates skew between the various output clock signals distributed throughout the device. FIG. 1 illustrates DLL 100, comprised of delay element 110, which is typically a programmable delay line, control element 120, feedback loop 130, and clock distribution network 140. The DLL 100 monitors the input clock signal at clock terminal 150 (i.e., the clock signal supplied to the DLL from a source typically external to the FPGA device) and the clock distribution network 140. Control element 120 automatically adjusts delay element 110 so that clock edges reach the FPGA's internal flip-flops (not shown) in clock distribution network 140 exactly one clock period after they arrive at clock terminal 150. This closed-loop system effectively eliminates clock distribution delay by ensuring that clock edges arrive at internal flip-flops in synchronization with clock edges arriving at the DLL input (i.e., at clock terminal 150).

An important parameter for understanding the design and use of a DLL is the minimum clock frequency at which the DLL will lock, i.e., the minimum input clock frequency at which the delay element effectively compensates for timing delays.

In the production and testing of FPGAs, the manufacturer needs to verify that the lock frequency of each DLL in the chip meets certain specifications. As currently known in the art, one technique for testing and measuring this frequency is to use a stable external reference frequency generator that directly drives the DLL under test. The frequency of the external generator is swept from a high to a low value and the lock signal coming out of the DLL is observed for transition from the locked to the unlocked state. The frequency at which this transition takes place is the minimum lock frequency.

This prior art method requires numerous external devices and measurement systems. Additionally, this method requires the ability to make difficult connections directly to the DLL circuit within the chip. A further drawback is that the production environment in which FPGAs are tested is extremely noisy in terms of electrical interference. Therefore, it is very difficult to generate a stable, jitter-free frequency reference against which one can measure the DLL lock frequency.

What is needed is a low-noise method of testing a DLL such that its lock frequency can be determined. Such a technique must operate quickly and inexpensively in accordance with the needs of modern, high volume manufacturing systems.

SUMMARY OF THE INVENTION

The present invention is directed to a method and structure for measuring the minimum lock frequency of a delay locked loop (DLL) within a programmable integrated circuit device such as a field programmable gate array (FPGA). This structure requires only that the device be temporarily configured such that one DLL block is programmed as a ring oscillator (RO) and connected to the input terminal of a second DLL (the DLL under test). The ring oscillator thus forms a programmable frequency source for driving the DLL under test. In one embodiment of the present invention, the RO is fed directly to the DLL under test. In an alternate embodiment of the present invention, the ring oscillator DLL is connected to the DLL under test through a divider to provide a lower DLL drive frequency.

To test the DLL, the ring oscillator frequency is decreased until the DLL under test fails to lock. The frequency of the ring oscillator DLL at that point is measured by comparing it to the frequency of an external clock source (such as a crystal oscillator) using two counters. The counters are implemented within the programmable IC (e.g., the field programmable gate array) in one embodiment of the present invention. A first counter counts pulses from the external clock source. A second counter counts pulses from the ring oscillator. Both counters are allowed to run for a period of time. The frequency of the ring oscillator at the lower lock limit of the DLL is proportional to the ratio of the two counts.

BRIEF DESCRIPTION OF THE DRAWINGS

The present disclosure may be better understood, and its numerous objects, features, and advantages made apparent to those skilled in the art by referencing the accompanying drawings.

The use of the same reference symbols in different drawings indicates similar or identical items.

DETAILED DESCRIPTION OF THE DRAWINGS

The present invention is directed to a method and associated apparatus for measuring the minimum lock frequency of a delay locked loop (DLL) on an integrated circuit such as a field programmable gate array (FPGA), including an apparatus for testing such a DLL.

Figure 1:
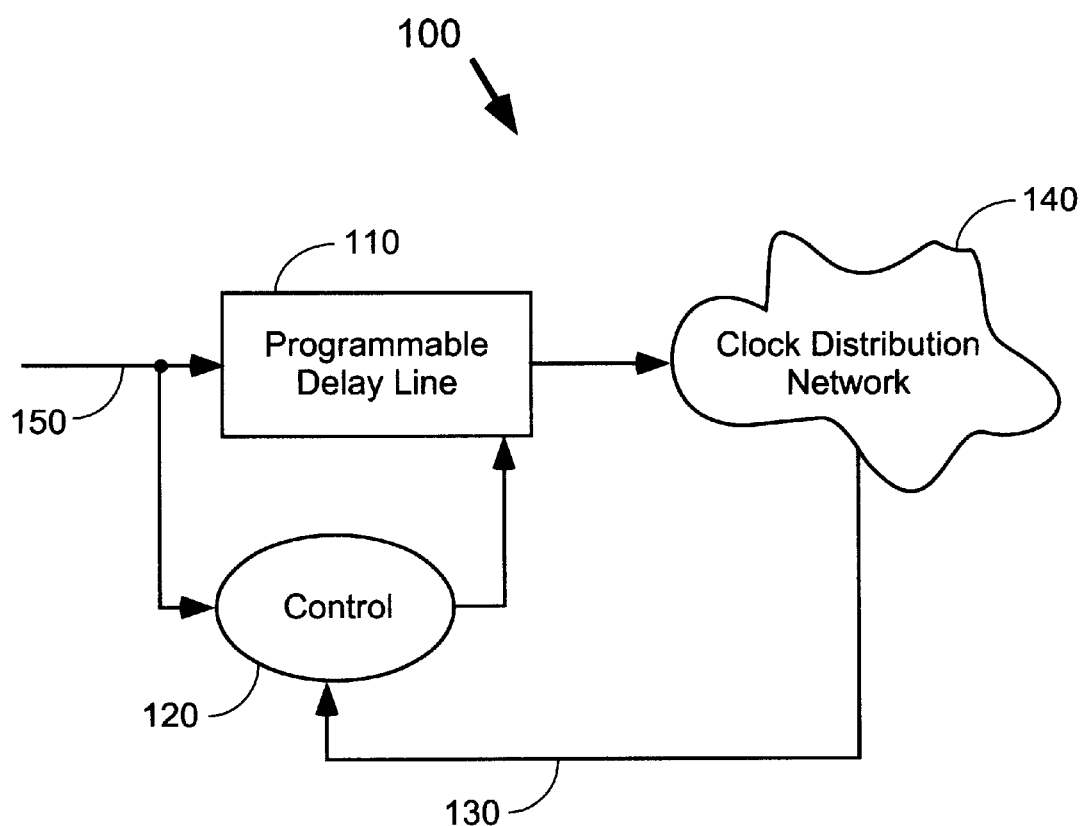
FIG. 1 is a high level schematic of a prior art delay locked loop.
Figure 2:
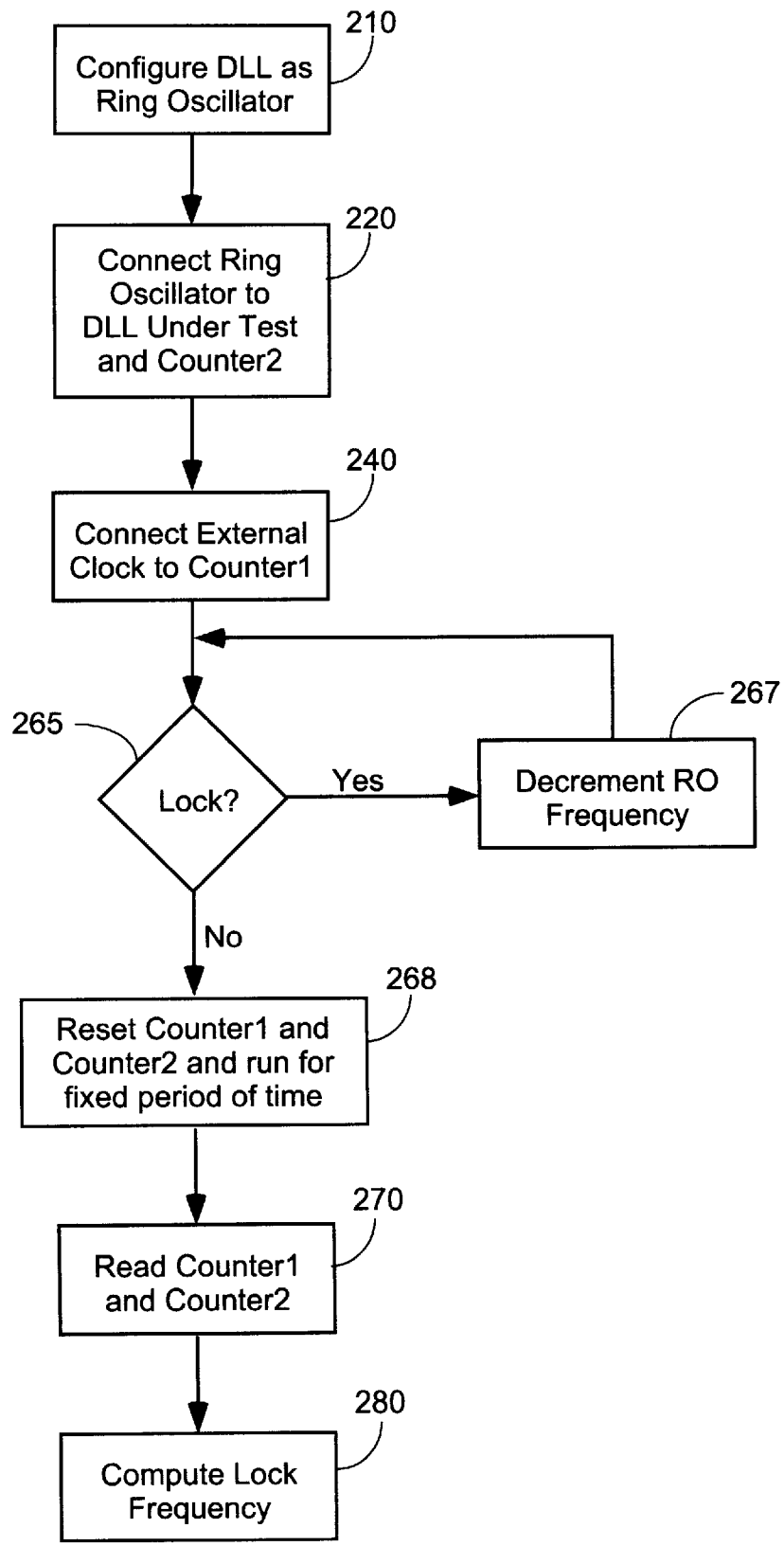
FIG. 2 is a flowchart of the test process according to one embodiment of the present invention.

A method of measuring the DLL lock frequency according to one embodiment of the invention is shown in FIG. 2. One DLL conventionally present on the FPGA device to be tested is selected and configured as a ring oscillator, step 210. This configuration is accomplished using standard, well-known, and well-documented FPGA programming techniques and software.

Next, at step 220, the ring oscillator-configured DLL (hereinafter, "ring oscillator" or RO) is connected as the clock input signal to the DLL to be tested ("DLL under test"), again by standard programming well known in the art. The output signal from the ring oscillator is also provided to a counter ("Counter2") on the FPGA. The counter may be implemented using hard-wired logic, or using standard programmable logic cells included in the FPGA for implementing user logic.

In one alternative embodiment, the ring oscillator is first connected to a divider circuit provided elsewhere in the FPGA in step 220. Such a divider circuit is itself well known in the art. The divider circuit may be implemented using hard-wired logic or standard programmable logic cells. The output of the divider circuit is thence connected to the DLL under test. The divider in this embodiment serves to lower the frequency of the ring oscillator as seen by the DLL under test for situations where the lock frequency is less than the lowest operating frequency achievable by the RO.

Next, an external clock source, such as a crystal oscillator or other stable, fixed-frequency time reference (all well known in the art) is connected to provide a reference clock signal to another counter on the FPGA ("Counter1") in step 240.

The lock signal from the DLL under test is monitored, step 265, to see if the DLL achieves lock. If the DLL under test achieves lock, the ring oscillator frequency is decremented to a next lower frequency, step 267. In one embodiment, the amount of frequency decrement is determined by the granularity of the ring oscillator's programmability, i.e., the frequency step is determined by a one-bit decrement in the delay loop.

After the DLL ring oscillator is decremented, the process loops though step 265 until the DLL under test first fails to lock. The testing process then proceeds to step 270, where Counter1 and Counter2 are reset and run for a fixed period of time (e.g., approximately 65,000 cycles as counted by Counter2) in Step 268. The lock frequency is computed in step 280 with the following equation:

$$LockFrequency = \left(\left(\frac{ExternalClockFrequency}{Counter1_t}\right)Counter2_t\right)$$

where $Counter1_t$ and $Counter2_t$ refer to the values in the counters after they have run for the fixed period of time in Step 268.

Figure 3:
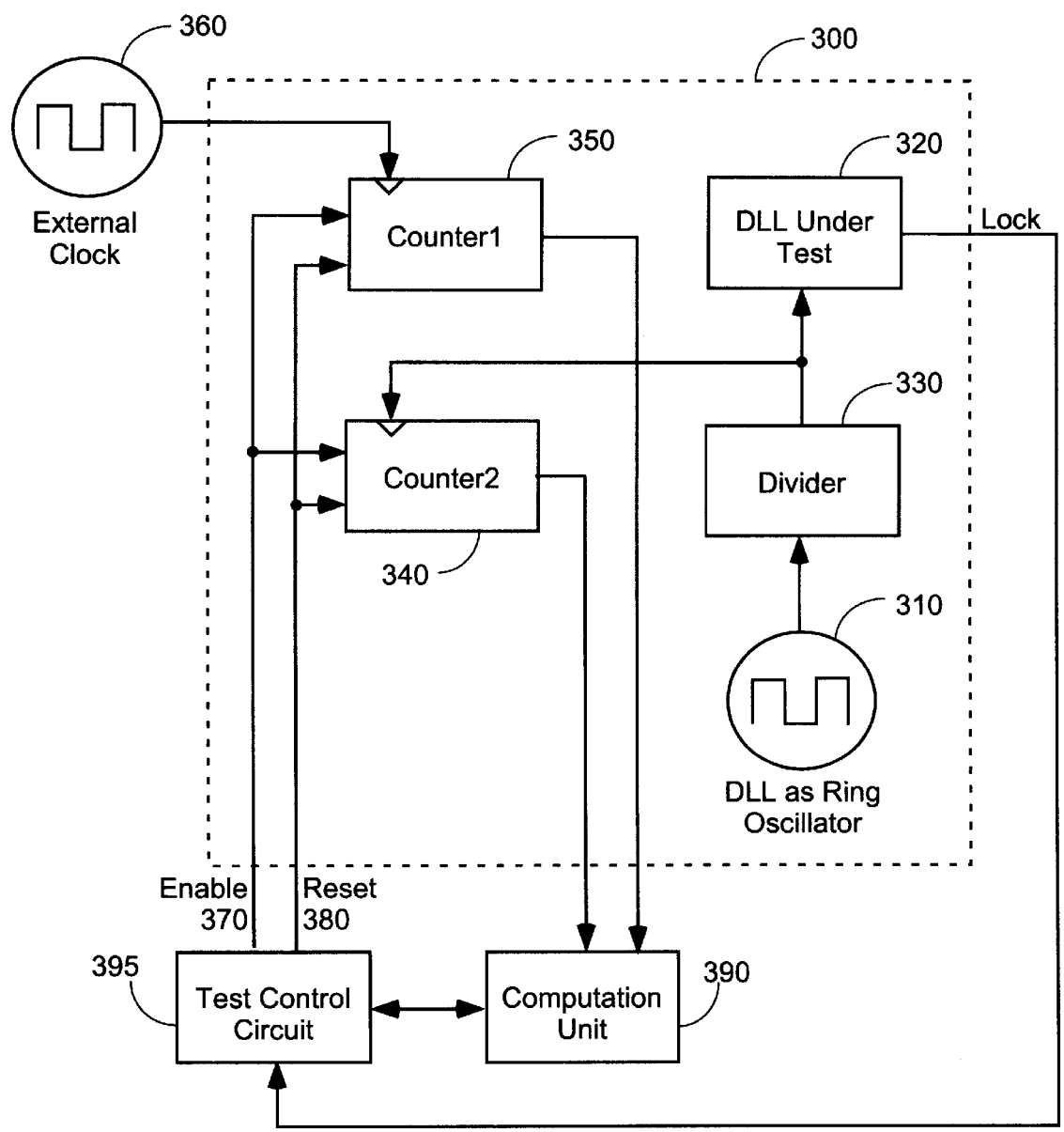
FIG. 3 is a block diagram of the structure of one embodiment of the present invention.

FIG. 3 shows a functional block diagram of a DLL measurement circuit partially implemented on an otherwise conventional FPGA 300 and configured to carry out the above process. Ring oscillator 310 is a DLL configured as a frequency source for DLL under test 320. Other conventional portions of FPGA 300 are not shown. As described above, if a lower frequency clock signal is needed at DLL under test 320, a divider 330 can be connected between ring oscillator 310 and DLL under test 330. In particular, when implemented on a member of the Virtex family of FPGAs from Xilinx, Inc., divider 330 is provided as a programmable function of the DLL configured as ring oscillator 310. This DLL functionality is further described in the Xilinx Data Book, page 3–12.

Counter2 340 is connected to the output terminal of ring oscillator 310 (or divider 330, where the divider is provided). Counter1 350 is driven by external clock source 360. Enable line 370 and reset line 380 are also provided on each counter 340 and 350. Both Counter1 350 and Counter2 340 are, in one embodiment of the present invention, implemented on the same FPGA using standard FPGA programming. Alternatively, Counter1 and Counter2 may be external, i.e., not on the IC device under test, but provided by other computer software or hardware.

Counter1 350 and Counter2 340 are read by computation unit 390, which performs the lock frequency computation according to the formula above. The frequency of external clock source 360 is supplied to computation unit 390 by user input or by direct connection through test control circuit 395. Synchronization of the two counters by means of the enable and reset lines 370 and 380, respectively, is accomplished by test control circuit 395. Such synchronization is well-known in the art, as is monitoring of the DLL lock signal.

Although the programming and testing of DLLs on an FPGA is described, those skilled in the art will realize that programmable ICs other than FPGAs may benefit from an analogous test method and apparatus. For example, the invention can be applied to Application Specific Integrated Circuits (ASICs). Accordingly, the present invention is not limited to any particular type of programmable IC or device.

Likewise, while external clock source 360, enable and reset lines 370 and 380, computation unit 390, and test control circuit 395 are shown in FIG. 3 as external to FPGA 300, in other embodiments they are not necessarily external to the IC under test. One of ordinary skill in the art will readily appreciate that all of these elements or any of them can be implemented on the programmable device under test. For example, in one embodiment computation unit 390 and test control unit 395 are implemented in FPGA 300 using standard programmable logic cells available on the FPGA.

In an embodiment employing an on-chip, internal clock source (i.e., a clock source implemented as part of the device under test) rather than an external clock source, the accuracy of the lock frequency measurement is limited to that of the on-chip clock source.

Computation unit 390 and test control 395 likewise may be located on the IC under test (on-chip), for instance as logic and arithmetic elements of a well-known FPGA. In such an embodiment, they are configured (programmed) for test purposes to read the DLL lock signal and counters 340 and 350 and to receive as an input signal the frequency of external clock source 360.

Alternatively, computation unit 390 and test control 395 may be completely external to the device under test. In the latter situation, computation unit 390 and/or test control circuit 395 can be implemented in software executing on a general purpose digital computer. As a further alternative, computation unit 390 and/or test control circuit 395 can be implemented in a combination of hardware and software and/or firmware in a test and measurement system dedicated to testing ICs.

One of ordinary skill in the art will readily appreciate that a wide variety of test configurations are possible; accordingly, the present invention is not limited to any one test embodiment. Furthermore, one of ordinary skill in the art will also appreciate that such testing may be operated manually, step-by-step, or through automatic program control, as by the well-known computer or sequencer. The present invention is thus not limited to any particular method of execution of the steps of FIG. 2.

The method of the present invention may be performed in either hardware, software, or any combination thereof, as those terms are currently known in the art. In particular, the present method may be carried out by software, firmware, or microcode operating on a computer or computers of any type. Additionally, software embodying the present invention may comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Furthermore, such software may also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

While particular embodiments of the present invention have been shown and described, it will be apparent to those skilled in the art that changes and modifications may be made without departing from this invention in its broader aspect and, therefore, the appended claims are to encompass within their scope all such changes and modification as fall within the true spirit and scope of this invention.

I claim:

1. A method of testing a lock frequency of a delay locked loop (DLL) under test, comprising:
    configuring a first DLL as a ring oscillator (RO) having an RO output signal;
    providing the RO output signal to the DLL under test, where the DLL under test has a lock output signal, the lock output signal having a locked state and an unlocked state;
    keeping a first count of a clock signal;
    keeping a second count of the RO output signal;
    monitoring the lock output signal;
    if the lock output signal is in the unlocked state:
        resetting the first count and the second count;
        running the RO for a predetermined period of time;
        reading the first count and the second count; and
        computing the lock frequency from the first count and the second count; and
    if the lock output signal is in the locked state:
        decrementing a frequency of the RO output signal; and
        returning to monitoring the lock output signal.

2. The method of claim 1, wherein providing the RO output signal to the DLL under test comprises dividing the RO output signal prior to providing the RO output signal.

3. The method of claim 1, wherein the first DLL and the DLL under test are part of the same field programmable gate array device.

4. The method of claim 1, wherein the first DLL and the DLL under test are part of the same programmable ASIC.

5. The method of claim 1, wherein the clock signal is at a stable fixed frequency.

6. The method of claim 1, wherein the first DLL, the DLL under test, the first count, and the second count are provided on a single integrated circuit device.

7. The method of claim 6, wherein the integrated circuit device is a field programmable gate array.

8. An apparatus for testing a lock frequency of a delay lock loop (DLL) under test, comprising:
    a first DLL configured as a ring oscillator (RO) having an RO output terminal;
    the DLL under test having a clock input terminal and a lock signal output terminal providing a lock signal, the lock signal having a locked state and an unlocked state, wherein the RO output terminal is connected to the clock input terminal of the DLL under test;
    a clock source having a clock source output terminal;
    a first counter having a reset input terminal, a clock input terminal, and a count output terminal, wherein the clock source output terminal is connected to the clock input terminal of the first counter;
    a second counter having a reset input terminal, a clock input terminal, and a count output terminal, wherein the RO output terminal is connected to the clock input terminal of the second counter; and
    a control element, the control element further comprising a computation unit and a test control circuit, wherein:
        the count output terminal of the first counter and the count output terminal of the second counter are connected to the computation unit;
        the lock signal output terminal is connected to the test control circuit; and
        the test control circuit is connected to the reset input terminal of the first counter and the reset input terminal of the second counter;
    wherein the control element measures the lock frequency of the DLL under test.

9. The apparatus of claim 8, wherein the RO output terminal is connected to the clock input terminal of the DLL under test through a divider circuit.

10. The apparatus of claim 8, wherein the first DLL and the DLL under test are part of the same programmable ASIC.

11. The apparatus of claim 8, wherein the clock source is a stable fixed frequency oscillator.

12. The apparatus of claim 8, wherein the first DLL, the DLL under test, the first counter, and the second counter are part of a single integrated circuit device.

13. The apparatus of claim 12, wherein the integrated circuit device is a field programmable gate array.

14. A computer system for testing a lock frequency of a delay lock loop (DLL) under test, comprising computer instructions for:
    configuring a first DLL as a ring oscillator (RO) having an input signal and an RO output signal;
    providing the RO output signal to a DLL under test having a lock output signal, the lock output signal having a locked state and an unlocked state;
    keeping a first count of a clock signal;
    keeping a second count of the RO output signal;
    monitoring the lock output signal;
    if the lock output signal is in the unlocked state:
        resetting the first count and the second count;
        running the RO for a predetermined period of time;
        reading the first count and the second count; and
        computing the lock frequency from the first count and the second count; and
    if the lock signal output is in the locked state:
        decrementing a frequency of the RO output signal; and
        returning to monitoring the lock output signal.

15. The computer system of claim 14, wherein providing the RO output signal to the DLL under test comprises dividing the RO output signal prior to providing the RO output signal.

16. The computer system of claim 14, wherein the first DLL and the DLL under test are part of the same field programmable gate array device.

17. The computer system of claim 14, wherein the first DLL and the DLL under test are part of the same programmable ASIC.

18. The computer system of claim 14, wherein the clock signal is at a stable fixed frequency.

19. The computer system of claim 14, wherein the first DLL, the DLL under test, the first count, and the second count are provided on a single integrated circuit device.

20. The computer system of claim 19, wherein the integrated circuit device is a field programmable gate array.

21. A computer-readable storage medium, comprising computer instructions for:

configuring a first delay locked loop (DLL) as a ring oscillator (RO) having an RO output signal;
providing the RO output signal to a DLL under test having a lock output signal, the lock output signal having a locked state and an unlocked state;
keeping a first count of a clock signal;
keeping a second count of the RO output signal;
monitoring the lock output signal;
if the lock output signal is in the unlocked state:
resetting the first count and the second count;
running the RO for a predetermined period of time;
reading the first count and the second count; and
computing a lock frequency of the DLL under test from the first count and the second count; and
if the lock output signal is in the locked state:
decrementing a frequency of the RO output signal; and
returning to monitoring the lock output signal.

22. The computer-readable storage medium of claim 21, wherein providing the RO output signal to the DLL under test comprises dividing the RO output signal prior to providing the RO output signal.

23. The computer-readable storage medium of claim 21, wherein the first DLL and the DLL under test are part of the same field programmable gate array device.

24. The computer-readable storage medium of claim 21, wherein the first DLL and the DLL under test are part of the same programmable ASIC.

25. The computer-readable storage medium of claim 21, wherein the clock signal is at a stable fixed frequency.

26. The computer-readable storage medium of claim 21, wherein the first DLL, the DLL under test, the first count, and the second count are provided on a single integrated circuit device.

27. The computer-readable storage medium of claim 26, wherein the integrated circuit device is a field programmable gate array.

28. A computer data signal embodied in a carrier wave, comprising computer instructions for:

configuring a first delay locked loop (DLL) as a ring oscillator (RO) having an RO output signal;
providing the RO output signal to a DLL under test having a lock output signal, the lock output signal having a locked state and an unlocked state;
keeping a first count of a clock signal;
keeping a second count of the RO output signal;
monitoring the lock output signal; and
if the lock output signal is in the unlocked state:
resetting the first count and the second count;
running the RO for a predetermined period of time;
reading the first count and the second count; and
computing a lock frequency of the DLL under test from the first count and the second count;
if the lock output signal is in the locked state:
decrementing a frequency of the RO output signal; and
returning to monitoring the lock output signal.

29. The computer data signal of claim 28, wherein providing the RO output signal to the DLL under test comprises dividing the RO output signal prior to providing the RO output signal.

30. The computer data signal of claim 28, wherein the first DLL and the DLL under test are part of the same field programmable gate array device.

31. The computer data signal of claim 28, wherein the first DLL and the DLL under test are part of the same programmable ASIC.

32. The computer data signal of claim 28, wherein the clock signal is at a stable fixed frequency.

33. The computer data signal of claim 28, wherein the first DLL, the DLL under test, the first count, and the second count are provided on a single integrated circuit device.

34. The computer data signal of claim 33, wherein the integrated circuit device is a field programmable gate array.

* * * * *